(12) United States Patent
Tsai et al.

(10) Patent No.: US 10,006,824 B2
(45) Date of Patent: Jun. 26, 2018

(54) MICROELECTROMECHANICAL SYSTEMS (MEMS) PRESSURE SENSOR HAVING A LEAKAGE PATH TO A CAVITY

(71) Applicant: INVENSENSE, INC., San Jose, CA (US)

(72) Inventors: Julius Ming-Lin Tsai, San Jose, CA (US); Aleksey S. Khenkin, Nashua, NH (US); Baris Cagdaser, Sunnyvale, CA (US); James Christian Salvia, Belmont, CA (US); Fariborz Assaderaghi, Emerald Hills, CA (US)

(73) Assignee: INVENSENSE, INC., San Jose, CA (US)

( * ) Notice: Subject to any disclaimer, the term of this patent is extended or adjusted under 35 U.S.C. 154(b) by 389 days.

(21) Appl. No.: 14/500,854

(22) Filed: Sep. 29, 2014

(65) Prior Publication Data
US 2016/0091378 A1 Mar. 31, 2016

(51) Int. Cl.
| | |
|---|---|
| *G01L 9/12* | (2006.01) |
| *G01L 9/00* | (2006.01) |
| *G01L 19/00* | (2006.01) |
| *G01L 27/00* | (2006.01) |
| *H04R 19/00* | (2006.01) |
| *H04R 19/04* | (2006.01) |

(52) U.S. Cl.
CPC ............ *G01L 9/0073* (2013.01); *G01L 9/125* (2013.01); *G01L 19/0092* (2013.01); *G01L 27/002* (2013.01); *H04R 19/005* (2013.01); *H04R 19/04* (2013.01)

(58) Field of Classification Search
CPC ...................................................... G01L 9/125
See application file for complete search history.

(56) References Cited

U.S. PATENT DOCUMENTS

| | | | | |
|---|---|---|---|---|
| 5,452,268 A | * | 9/1995 | Bernstein | ............. H04R 19/005 367/181 |
| 2008/0039027 A1 | * | 2/2008 | Mohammadi | ............. H03L 7/06 455/76 |
| 2010/0054495 A1 | * | 3/2010 | Harney | ................ H04M 1/035 381/92 |
| 2014/0133685 A1 | | 5/2014 | Liu et al. | |

FOREIGN PATENT DOCUMENTS

JP 2008256433 A 10/2008

OTHER PUBLICATIONS

Kuttruff, Heinrich. "Acoustics An Introduction—Chapter 18. Microphones" CRC Press, Jan. 1, 2006, retrieved on Nov. 9, 2015, 24 pages.
International Search Report and Written Opinion for PCT Application No. PCT/US2015/049209, dated Nov. 20, 2015, 13 pages.

* cited by examiner

*Primary Examiner* — Clayton E LaBalle
*Assistant Examiner* — Dennis Hancock
(74) *Attorney, Agent, or Firm* — Amin, Turocy & Watson, LLP

(57) ABSTRACT

Microelectromechanical systems (MEMS) pressure sensors having a leakage path are described. Provided implementations can comprise a MEMS pressure sensor system associated with a back cavity and a membrane that separates the back cavity and an ambient atmosphere. A pressure of the ambient atmosphere is determined based on a parameter associated with movement of the membrane.

21 Claims, 14 Drawing Sheets

MICROELECTROMECHANICAL SYSTEMS (MEMS) PRESSURE SENSOR HAVING A LEAKAGE PATH TO A CAVITY

TECHNICAL FIELD

The subject disclosure relates to microelectromechanical systems (MEMS) pressure sensors.

BACKGROUND

Conventionally, microelectromechanical systems (MEMS) pressure sensors can comprise a MEMS chip attached to a substrate. These MEMS pressure sensors are generally formed with a rigid membrane separating a sealed cavity and an atmosphere. A pressure difference between the sealed cavity and the atmosphere cause a deformation of the membrane. Typically, the membrane separates the sealed cavity from the atmosphere and an absolute position of the membrane is determined. In conventional applications, the absolute position of the membrane is used to determine the atmospheric pressure. Determining the deformation of the membrane can include determining a change in capacitance, resonant frequency, and/or embedded resistance.

However, characteristics, such as sensitivity, frequency response, accuracy etc., of such conventional MEMS pressure sensors are limited by the MEMS device's design and the physical constraints imposed on the geometry of the package. Further, determining the absolute position can be problematic for several reasons, including potential damage to packaging, alteration of packaging due to temperature, frequent need for recalibration, and the like. Such systems can also suffer from false signals in offset or sensitivity induced by stress experienced by the packaging. These systems are also limited in the maximum pressure that they are able to sense due to, for instance, the mechanical strength of the membrane. Damage to the sealed cavity or packaging can further result in conventional pressure sensors becoming defective, unreliable, and/or unusable. Adding to the limitations of conventional pressure sensors is the difficulty of measuring small variations of atmospheric pressure against the large values of atmospheric pressure.

It is thus desired to provide MEMS pressure sensors that improve upon these and various other deficiencies. The above-described deficiencies of conventional MEMS pressure sensors are merely intended to provide an overview of some of the problems of conventional implementations, and are not intended to be exhaustive. Other problems with conventional implementations, techniques, and corresponding benefits of the various aspects described herein may become apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, a MEMS pressure sensor device associated with a back cavity and at least one leakage path that can determine a pressure (e.g., atmospheric pressure, environmental pressure, etc.) is provided according to aspects of the subject disclosure. Thus, a device comprising a package comprising a MEMS pressure sensor element is described. The MEMS pressure sensor element can be associated with one or more back cavities. According to an aspect, the package substrate can be provided with a port adapted to receive an ambient atmosphere. The pressure sensor element can comprise a membrane or barrier that can be deformed and a leakage path (e.g., vent holes) that fluidly connects the ambient atmosphere and the back cavity. Altering the membrane can alter a volume of the back cavity and force air to flow into or out of the back cavity. As the membrane is allowed to return to an original position or a position of rest, a time constant associated with allowing the membrane to enter a position of rest can be measured. A pressure can be determined based on the time constant and pressure information can be derived from the time constant. In another aspect, systems can determine a low cut-off frequency associated with movement of the membrane.

Moreover, an exemplary method associated with a MEMS pressure sensor is described. The method can comprise deforming a membrane of a MEMS pressure sensor. Deforming the membrane forces air to flow through a leakage path (e.g., vent hole(s)). In another aspect, the method can comprise holding the membrane at an altered position for a period and releasing the membrane to allow the membrane to come to rest. Time information associated with allowing the membrane to rest can be determined. Based on the time information, a pressure associated with an environment can be measured.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
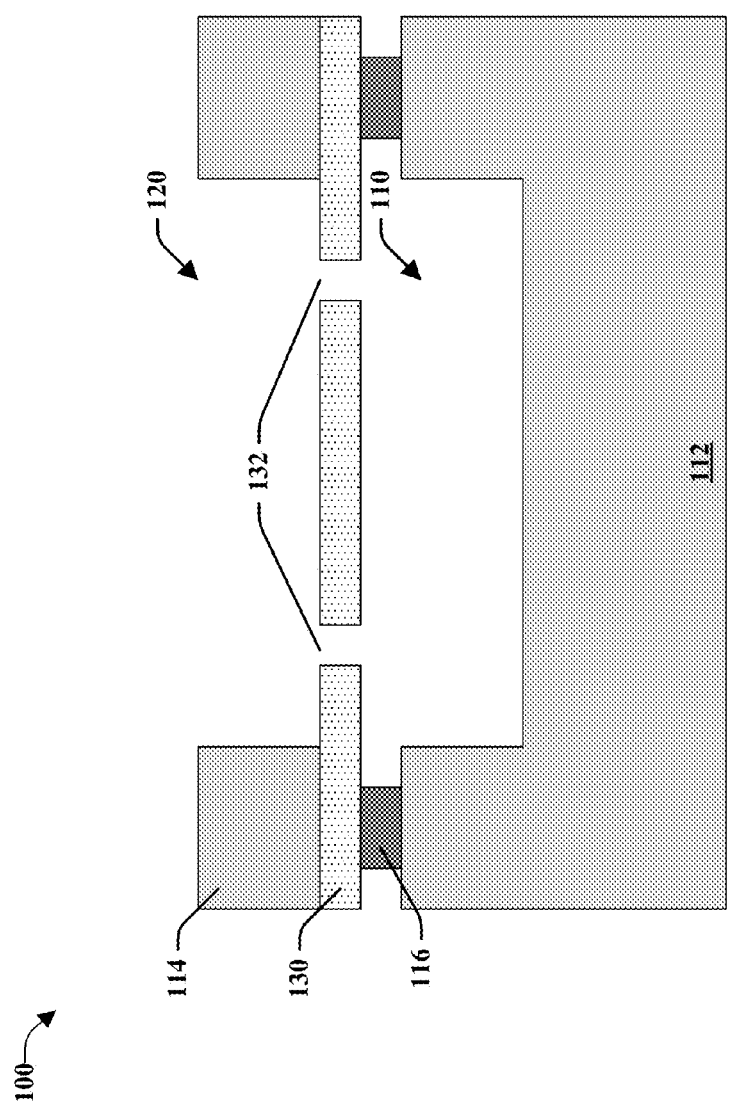
FIG. 1 depicts a non-limiting schematic cross section diagram of a microelectromechanical systems (MEMS) pressure sensor system associated with a leakage path through a membrane of the MEMS pressure sensor system, according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques, and methods of the subject disclosure are described in the context of MEMS pressure sensors. However, as further detailed below, various exemplary implementations can be applied to other areas of MEMS sensor design and packaging, without departing from the subject matter described herein.

As used herein, the terms MEMS pressure sensor(s), MEMS microphone(s), and the like are used interchangeably unless context warrants a particular distinction between such terms. For instance, the terms can refer to MEMS devices or components that can measure pressure, acoustic characteristics, or the like.

Additionally, terms such as "at the same time," "common time," "simultaneous," "simultaneously," "concurrently," "substantially simultaneously," "immediate," and the like are employed interchangeably throughout, unless context warrants particular distinctions among the terms. It should be appreciated that such terms can refer to times relative to each other and may not refer to an exactly simultaneously action(s). For example, system limitations (e.g., processor speed, memory access speed, etc.) can account for delays or unsynchronized actions. In other embodiments, such terms can refer to acts or actions occurring within a period that does not exceed a defined threshold amount of time.

Terms such as "a pressure", "an environmental pressure", "an atmospheric pressure", and the like are employed interchangeably throughout, unless context warrants particular distinctions among the terms. It should be appreciated that such terms can refer to a pressure of a particular environment or a pressure relative to a particular location. For example, an atmospheric pressure may refer to a pressure associated with an open environment (e.g., pressure of the earth's atmosphere at a given location), a closed environment (e.g., pressure in a structured, vehicle, aviation machine, self-contained environment, etc.), or the like. As such, an atmosphere or environment is not intended to be limited to a specific or absolute atmosphere or environment, but rather refer to a relative location.

Sensitivity and durability of traditional pressure sensors are limited by constraints on devices. In these traditional pressure sensors, membranes separate a sealed chamber from an environment and the pressure sensor determines the pressure based on measuring a displacement of the membrane. The displacement of the membrane is a result of a difference between the pressure within the sealed chamber and the pressure of the external environment. Package induced stress on the membrane, leaks in the back cavity, or other forces acting on the package (e.g., temperature induces alterations of the package/membrane) can cause inaccurate readings, permanent damage, false signals, and the like. These systems are also limited in the maximum pressure that they are able to sense due to, for instance, the mechanical strength of the membrane. Damage to the sealed cavity or packaging can further result in conventional pressure sensors becoming defective and/or unusable. Moreover, such systems can be relatively power intensive (e.g., in comparison with aspects disclosed herein). Efficient management of power consumption is particularly important in mobile electronics, such as smart phones, tablet computers, handheld electronics, and the like.

To these and/or related ends, various aspects of MEMS pressure sensor system associated with leakage paths connecting back cavities and an environment are described. For instance, exemplary implementations can provide a MEMS pressure sensor (e.g., acoustic sensor, microphone, etc.) having a back cavity and a membrane separating the back cavity and an environment. A leakage path (e.g., vent holes, apertures, etc.) fluidly connects the back cavity and the environment. A controller can induce an alteration of the membrane to displace or deform the membrane. The controller can also allow the membrane to come to rest or an original position (e.g., release a force that induced the alteration) and can determine a time constant associated with movement of the membrane as it is allowed to come to rest. In an aspect, the MEMS pressure sensor system can determine an environmental or atmospheric pressure based on the time constant. As a non-limiting example, the MEMS pressure system can increase accuracy of the measured pressure based on a temperature of the environment and accounting for aspects of the MEMS pressure sensor system, such as resistance associated with a leakage path.

As a non-limiting example, a MEMS pressure sensor system can be comprised in a user device, such as a smart phone. An active user may utilize the smart phone during physical activities such as hiking. As the user hikes, the environmental temperature, and atmospheric pressure may change, sometimes drastically changing. The user can utilize various disclosed embodiments of a MEMS pressure sensor to reliably determine the atmospheric pressure. In contrast, traditional pressure sensors may be subject to inaccuracies and increased power consumption resulting in inefficient or less efficient power consumption and inaccurate readings. The above is but one example of an embodiment of the subject disclosure. Accordingly, various other uses and/or embodiments will become apparent.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that certain aspects of disclosure may be practiced without these specific details, or with other methods, components, parameters, etc. In other instances, well-known structures and devices are shown in block diagram form to facilitate description and illustration of the various embodiments.

Accordingly, FIG. 1 depicts a non-limiting schematic cross sectional diagrams of a system 100 (e.g., a MEMS sensor system) capable of determining an atmospheric pressure, according to various non-limiting aspects of the subject disclosure. It is to be appreciated that system 100 can be used in connection with implementing one or more systems, methods, or components shown and described in connection with other figures disclosed herein. It is noted that all or some aspects of system 100 can be comprised in larger systems such as servers, computing devices, smart phones, laptop computers, personal digital assistants, and the like. Further, it is noted that the embodiments can comprise additional components not shown for sake of brevity. Additionally, various aspects described herein may be performed by one device or two or more devices in communication with each other.

As depicted, system 100 can primarily comprise an enclosure 112 that forms a back cavity 110, one or more application specific integrated circuit (ASIC) chip(s) 116, a sensor element 130 (e.g., membrane, diaphragm, etc.) having vent holes 132, and package substrate 114 (e.g., such as a laminate package substrate, package substrate 214 (see below), package substrate 414 (see below), etc.). In various embodiments, enclosure 112 can be formed integral to the sensor element 130, or can be formed separately and bonded to sensor element 130. For instance, enclosure 112 can be bonded to sensor element 130, formed separately from sensor element 130, and mechanically (or otherwise) affixed to a package substrate to surround sensor element 130, or the like. It is noted that, one or more of sensor element 130, ASIC chip 116, or enclosure 112 can be one or more of electrically coupled or mechanically affixed to a package substrate via methods available to those skilled in the art. In addition, sensor element 130 can be mechanically, electrically, and/or communicatively coupled to ASIC chip 116 and/or a package substrate.

In various embodiments, system 100 can be comprised within a microphone package enclosure comprising a microphone package substrate, a lid that houses the MEMS microphone element, and various other components. In an aspect, the microphone package enclosure promotes the direction of an acoustic pressure through a port in the microphone package substrate adapted to direct the acoustic pressure to system 100, and more particularly to sensor element 130 and vent holes 132.

Figure 3:
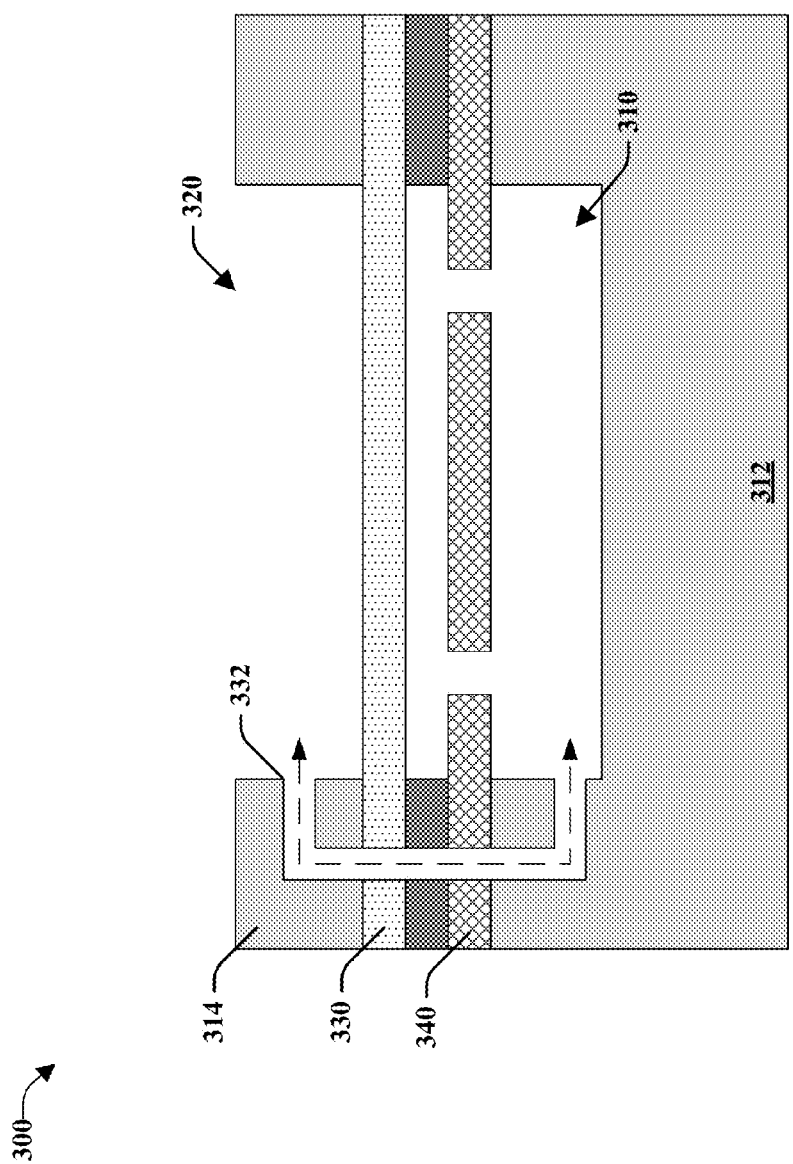
FIG. 3 depicts a non-limiting schematic cross section diagram of a MEMS pressure sensor system associated with a capacitance plate and a leakage path through a packaging of the MEMS pressure sensor system, according to various non-limiting aspects of the subject disclosure.
Figure 4:
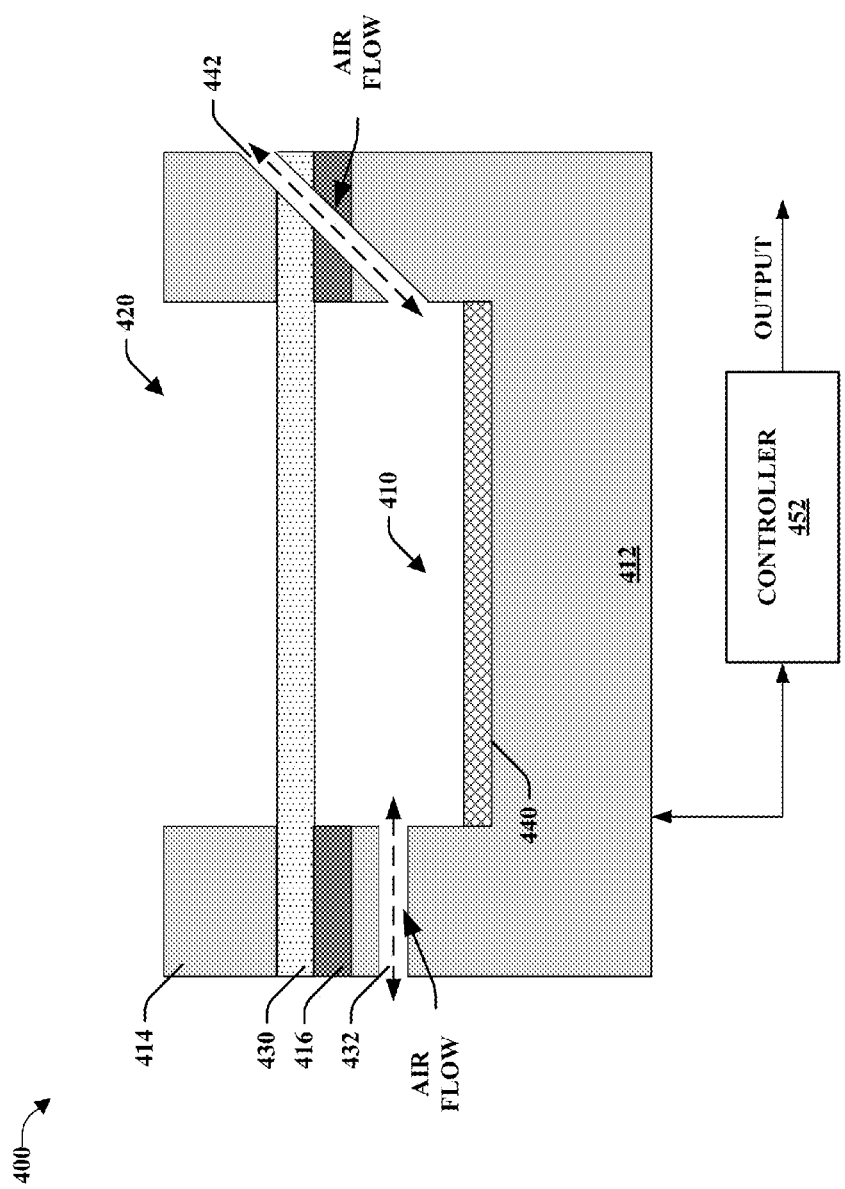
FIG. 4 depicts a non-limiting schematic cross section diagram of a MEMS pressure sensor system associated with a capacitance plate and a controller, according to various non-limiting aspects of the subject disclosure.

According to at least one embodiment, sensor element 130 can comprise one or more vent holes 132 forming a leakage path between an ambient atmosphere 120 and back cavity 110. It is noted that descriptions of embodiments may utilize terms such as "vent holes," "holes," "apertures," "ports," "orifices," or the like, to refer to one or more leakage paths. It is noted that such terms can be used interchangeably unless contexts warrants a particular distinction between such terms. In various embodiments, sensor element 130 can comprise any number of vent holes 132 arranged in any number of configurations, such as equidistant from a center of sensor element 130 and a distal end of sensor element 130. In at least one embodiment, vent holes 132 can comprise similar dimensions or shapes. For instance, vent holes 132 can be cylindrical, substantially cylindrical, regular or irregular n-sided prism, conical, substantially conical, or virtually any other shape. Moreover, vent holes 132 may have smooth and/or textured walls (e.g., ribbed, rifled, dimpled, etc.). For instance, FIG. 1 depicts sensor element 130 comprising two vent holes 132 having a cylindrical configuration and evenly spaced from a center of sensing element 130. It is appreciated that sensor element 130 may not comprise vent holes 132. As such, vent holes can be formed within disparate components as depicted in FIGS. 3 and 4. Moreover, vent holes 132 may not be formed during manufacturing. Rather, vent holes 132 may represent cracks or leakage paths formed as a result of damage to the sensing element 130 or other structures in the other figures (e.g., packaging in FIGS. 3-4).

Sensor element 130 can be deformable or moveable. For instance, sensor element 130 can be deformed (e.g., by a force) such that sensor element 130 or a portion thereof is convex or concave with respect to back cavity 110. In another aspect, sensor element 130 may be rigid (e.g., not deformable or substantially not deformable) but movable in some other manner. Deforming sensor element 130 forces air through vent holes 132. For instance, if the volume of back cavity 110 is decreased as a result of deforming sensor element 130, air is forced out of back cavity 110 and into ambient atmosphere 120. Likewise, if the volume of back cavity 110 is increased as a result of deforming sensor element 130, air is forced into back cavity 110 and from ambient atmosphere 120. As air is forced through vent holes 132, the pressure of the back cavity 110 and the pressure of the ambient atmosphere 120 are equalized or substantially equalized. With an initial displacement of sensor element 130, there is restoring force acting on sensor element 130. As the restoring force is allowed to act on sensor element 130 (i.e., the restoring force is released), sensing element 130 is forced to a resting position. As sensing element 130 is forced to the resting position, the volume of back cavity 110 will change, thereby forcing air to pass through vent holes 132 as the pressure in the back cavity 110 and ambient atmosphere 120 equalizes or substantially equalizes.

Due at least in part to leakage path resistance, there is a time constant associated with equalizing the pressure between the ambient atmosphere 120 and back cavity 110. In various aspects, the inverse of the time constant can be determined as the low cut-off frequency for system 100. The time constant and/or low cut-off frequency can be utilized to measure the pressure of the ambient atmosphere 120 as described in various embodiments herein. Similar functionality is apparent with respect to the embodiments described below regarding FIGS. 2-8.

Figure 2:
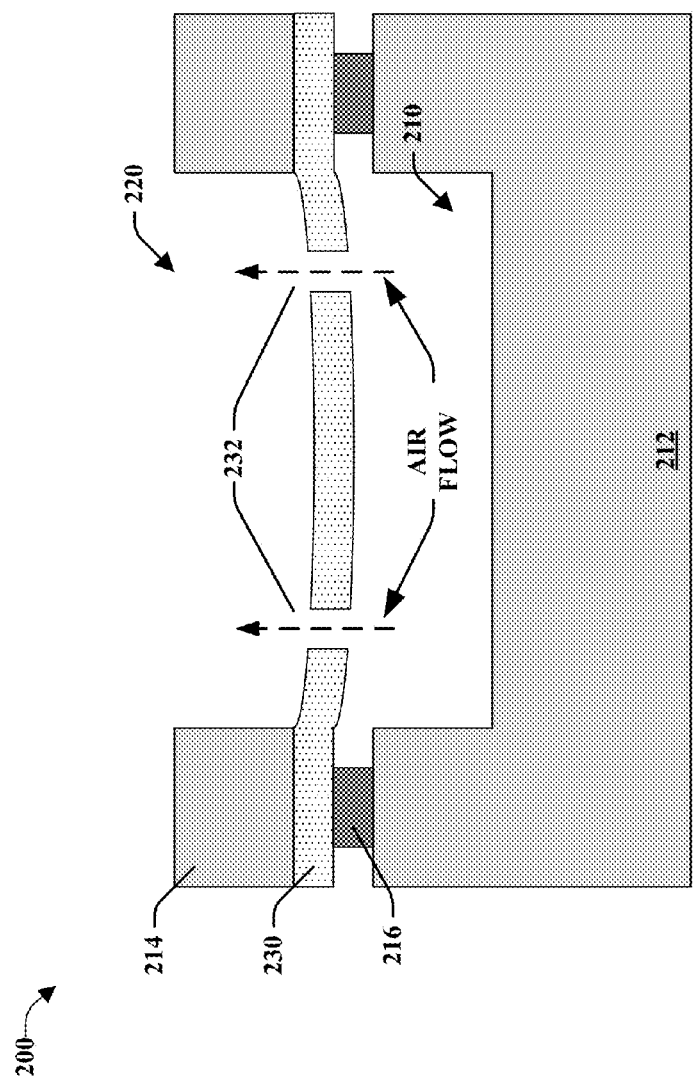
FIG. 2 depicts a non-limiting schematic cross section diagram of a MEMS pressure sensor system associated with a leakage path in which a membrane of the MEMS pressure sensor system is deformed, according to various non-limiting aspects of the subject disclosure.

Turning to FIG. 2, there depicted is a non-limiting schematic cross sectional diagram of a system 200 (e.g., a MEMS sensor system) capable of determining an atmospheric pressure, according to various non-limiting aspects of the subject disclosure. In an aspect, system 200 can comprise all or some components and all or some functionality described with reference to system 100. It is noted that system 200 can be comprised in larger systems. It is further noted that system 200 can be an acoustic sensor element or a MEMS microphone system.

As depicted, system 200 comprises a membrane or sensor element 230 deformed by a force. The force can displace sensor element 230 from an initial or resting position (e.g., equilibrium position). As sensor element 230 is deformed, air is forced through vent holes 232. After force is applied for a time, the pressure between the back cavity 210 and ambient atmosphere 220 is equalized.

In embodiments, the force can be a constant or substantially constant force. In an aspect, the force can be ramped to a certain value or level. The force can be held until pressure equalizes (e.g., sensing element 230 no longer moves or is substantially still), for a determined amount of time, or the like. Once the force is released, sensor element 230 will settle (or begin to settle) to the resting position. It is noted that a starting position of sensor element 230 before deformation may or may not be equivalent to the ending position of sensor element 230 after the force is released (e.g., after pressure equalizes).

A time constant associated with allowing the sensor element 230 to settle (e.g., after force is released) can be measured. The time constant can be measured to represent movement of sensor element 230, as described herein. Such determining can be based on a signal received from system 200, such as a signal received at a controller. In various embodiments, the time constant can be correlated with a particular pressure value or range of pressure values. For example, determined time constants can be respectively associated with determined pressure values in a lookup table. In another example, a conversion process can convert the time constants to respective pressure values.

Referring now to FIG. 3, there depicted is a non-limiting schematic cross sectional diagram of a system 300 (e.g., a MEMS sensor system), comprising a capacitor configuration, that is capable of determining an atmospheric pressure, according to various non-limiting aspects of the subject disclosure. For example, system 300 can determine a pressure based on a time constant associated with a movement of at least one capacitor plate.

As depicted, system 300 can primarily comprise an enclosure 312, a sensor element 330, a leakage path 332 (e.g., which fluidly connects a back cavity 310 with an ambient atmosphere), and a plate element 340. Leakage path 332 can comprise an aperture or hole forming a path or tunnel through enclosure 312. In various embodiments, leakage path 332 can comprise a liner, substance, or material that can reduce the leakage path resistance. As described herein, system 300 and various other embodiments can comprise various numbers of leakage paths having various dimensions and configurations.

Plate element 340 can comprise a bottom plate of a capacitor with the sensor element 330 forming a top plate of the capacitor. In this configuration, the plate element 340 and sensor element 330 can be comprised of material that can act as an electrical conductor. It is noted that plate element 340 and sensor element 330 can be formed of a common material or can be formed of disparate materials. It is further noted that references to a bottom plate or top plate are utilized for explanation, as such, either plate element 340 or sensor element 330 can be a top plate or bottom plate.

A voltage source can be coupled to system 300. The voltage can be applied to the capacitor to generate a voltage differential between sensor element 330 and plate element 340. As such, one or both of sensor element 330 and plate element 340 (or another structure) can receive a voltage from the voltage source. Applying a voltage to the capacitor results in an attractive force that can cause at least one of the plates to move. For instance, plate element 340 can be bounded, adhered to, or otherwise disposed within or affixed to enclosure 312, such that plate element 340 does not move when a force is applied to it. In another aspect, plate element 340 can be a perforated and rigid construction. However, it is noted that plate element 340 can be moveable or deformable in various other embodiments. Resistance in perforations of plate element 340 and/or motion of plate element 340 can be accounted for in accordance with various embodiments disclosed herein. Moreover, embodiments are not limited to those described in FIG. 3. For example, plate element 340 may be positioned above or below sensor element 330 in various embodiments. Additionally, plate element 340 can but need not be adjacent or substantially adjacent to sensor element 330.

FIG. 4 depicts a non-limiting schematic cross sectional diagrams of a system 400 (e.g., a MEMS sensor system), including a plate element, capable of determining an atmospheric pressure, according to various non-limiting aspects of the subject disclosure. It is noted that system 400 depicts exemplary embodiments of various aspects of the subject disclosure. As such, various embodiments depicted herein, with reference to the various other figures, can comprise all or some functionality described with reference to FIG. 4. Similarly, liked name components or elements of the various embodiments described herein can comprise similar functionality unless context suggests otherwise.

As depicted, vent holes 432 and 442 (e.g., leakage path) can fluidly connect ambient atmosphere 420 with back cavity 410, such that air can freely move between ambient atmosphere 420 and back cavity 410. It is appreciated that vent holes 432 and 442 are depicted as exemplary leakage paths. As such, system 400 can comprise one or both of vent holes 432 and 442, different arraignments and numbers of vent holes, or the like. It is noted that vent holes 432 and 442 can pass through several layers or elements, such as sensor element 430, plate element 440, and enclosure 412.

In further exemplary embodiments, system 400 can also comprise an ASIC complementary metal oxide semiconductor (CMOS) chip 416 associated with the pressure sensor element 430. In various aspects, system 400 can comprise a back plate (e.g., plate element 440) that can act as a stationary electrode in concert with a pressure sensor element 430 to facilitate the transduction of acoustic waves or pressure into an electrical signal that can be communicatively coupled to ASIC CMOS 416.

As described above, enclosure 412 can be formed integral to pressure sensor element 430, plate element 440, etc. In other embodiments, enclosure 412 can be formed separately and bonded to pressure sensor element 430 plate element 440, etc. In various non-limiting aspects, one or more of pressure sensor element 430, ASIC CMOS chip 416, plate element 440, or enclosure 412 can be one or more of electrically coupled or mechanically affixed to package substrate 414, via methods available to those skilled in the art.

As non-limiting examples, enclosure 412 can be bonded to plate element 440, plate element 440 can be bonded and electrically coupled to ASIC CMOS chip 416, and pressure sensor element 430 can be bonded and electrically coupled to ASIC CMOS chip 416 and to package substrate 414. It is noted that the various components or elements can be bonded to controller 452 (e.g., wire bonded, electrically bonded, mechanically bonded, etc). Thus, pressure sensor element 430, in the non-limiting example of system 400, can be mechanically, electrically, or communicatively coupled to the ASIC CMOS chip 416 or controller 452.

Furthermore, system 400 can comprise a lid or cover and package substrate 414 that, together, can comprise device or package 300, to which a customer printed circuit board (PCB) (not shown) having an orifice or other means of passing air or acoustic waves to pressure sensor element 430 can be mechanically, electrically, and/or otherwise coupled. In a non-limiting example, system 400 can be configured for operating in various modes, such as an environmental pressure sensing mode and a microphone mode. In a microphone mode, for example, acoustic waves can be received at pressure sensor element 430. An attached or coupled customer PCB (not shown) providing an orifice or other means of passing the air or acoustic waves facilitates receiving the air or acoustic waves at pressure sensor element 430.

A controller 452 can facilitate driving, sensing, and other functionality of system 400. In an aspect, controller 452 can comprise a processing device (e.g., computer processor, hardware processor, etc.) coupled to one or more components of system 400. In various embodiments, system 400 can comprise controller 452 or controller 452 can be coupled to system 400. It is further noted that controller 452 can have one or more connection paths to various components of system 400.

According to an aspect, controller 452 can be utilized to control a voltage source or other means for inducing a movement in pressure sensor 430. In an example, the controller 452 can comprise most any circuitry or components that can determine and/or program values of a voltage source during a particular time period, determine and/or program a switch to apply a reset signal, or the like. For instance, the controller 452 can set a bias voltage of a voltage source based on defined user/manufacturer policies, operating modes of the system 400, detection of events, etc.

In another aspect, controller 452 can receive signals from various components of system 400. For instance, controller 452 can receive an output signal (e.g., a voltage output) from system 400. The voltage can be passed through a voltage buffer and a processor can analyze the output to determine or measure a pressure. In various embodiments, the controller 452 can determine or adjust the measured pressure based on a leakage path resistance, a temperature, a level of humidity, design aspects of a device, various environmental factors, or the like. Moreover, results generated by controller 452 can be further analyzed or presented to a user via a display device (not shown), communicated to other systems, devices, or components, and the like.

To that end, the one or more processors can execute code instructions stored in memory, for example, volatile memory and/or nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data stores, databases) of the subject systems and methods is intended to comprise, without being limited to, these and any other suitable types of memory.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In various embodiments, pressure sensor element 430 can be a movable membrane that moves in response to an actuation voltage. For instance, controller 452 can apply an actuation voltage or bias voltage to plate element 440 that creates a voltage differential between plate element 440 and pressure sensor element 430. The voltage differential can induce or cause movement or displacement of pressure sensor element 430. With an initial displacement of pressure sensor element 430, there is restoring force acting on pressure sensor element 430 once the actuation voltage is released. This restoring force will then force or push pressure sensor element 430 to a resting position, causing air to flow into the back volume. As used herein, "resting position," "normal position," "equilibrium position," and the like are used interchangeably unless context suggests otherwise or warrants a particular distinction between the terms. Such terms can refer to a position, when external force is not applied and/or is equally applied, where pressure is equalized or substantially equalized between a back cavity and an ambient atmosphere. Furthermore, such terms may or may not refer to an original or initial position before displacement. In various other embodiments, such terms can refer to a position where force is equally applied such that pressure sensor element 430 is not moving. Furthermore, embodiments describing a "return to an original position" do not necessitate returning to the identical original position; rather a "return to an original position" can refer to a settling at a resting position.

Figure 5:
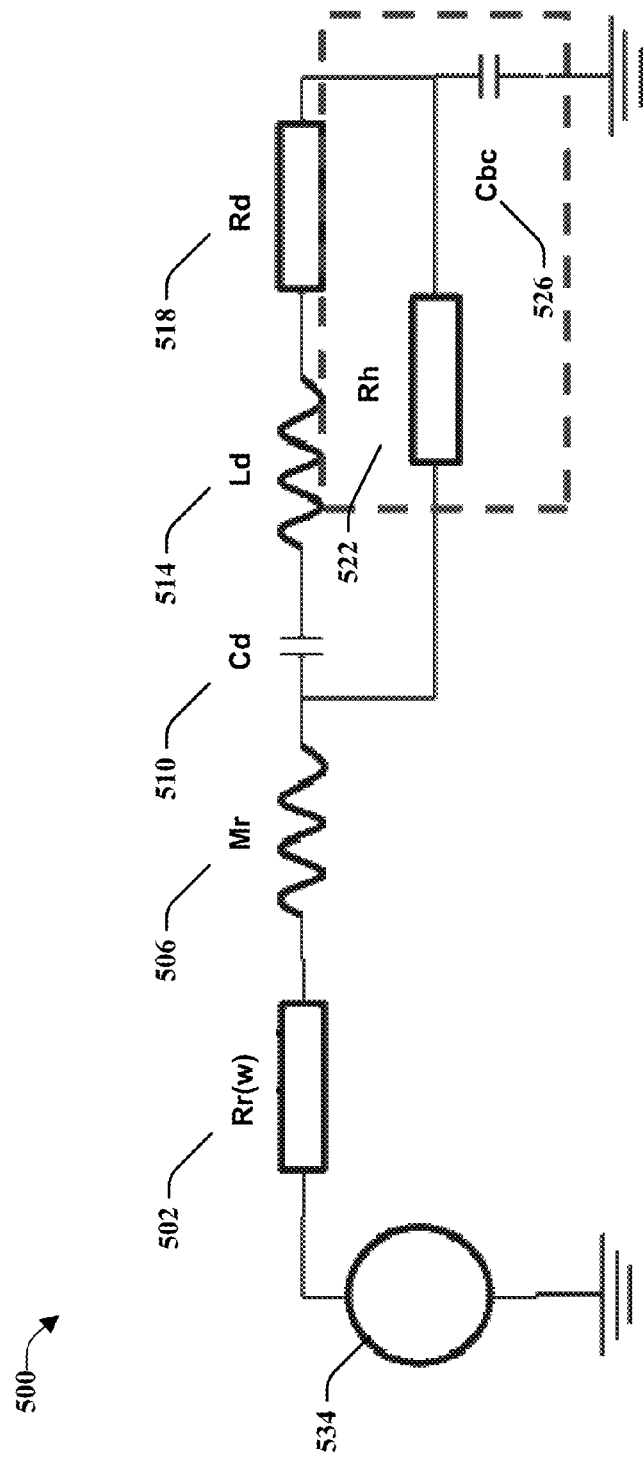
FIG. 5 depicts a non-limiting schematic of an exemplary circuit diagram of a MEMS pressure sensor system associated with a leakage path, according to various non-limiting aspects of the subject disclosure.

The behavior of various embodiments described herein can be represented by a circuit model, such as in FIG. 5. More particularly, FIG. 5 depicts a circuit diagram of a system 500 that represents a MEMS pressure sensor system capable of determining a pressure. It is appreciated that various other components or circuitry (not shown for readability) can be utilized in MEMS pressure sensor systems. It is further appreciated that various other embodiments can utilize different configurations to achieve functionality or similar functionality as described herein.

As depicted, system 500 can include a resistor 502 representing an acoustic radiation resistance (Rr), a resistor 506 representing an acoustic mass (Mr), a capacitor 510 representing a compliance (Cd) of a membrane (e.g., sensor element 130, 230, 330, 430, etc.), a resister 514 representing a mass (Ld) of the membrane, a resistor 518 representing the damping (Rd) of the membrane, a resistor 522 representing a leakage resistance (Rh) through a leakage path (e.g., vent holes 132, 332, 432, etc.), and a capacitor 526 representing a back volume compliance (Cbc). It is further noted that system 500 can include a voltage source 534 and a ground 530.

A response frequency (low cut-off frequency) can be deduced as:

$$F = \frac{1}{2\pi RhCbc} \quad (1)$$

From the fluid dynamics analysis, it is known that:

$$Rh = \text{constant} \quad (2)$$

$$Cbc \propto \frac{1}{P_0} \quad (3)$$

And therefore the low cut-off frequency is:

$$F \propto P_0 \quad (4)$$

From the above, it is shown that air density changes with different pressure and such changing the Cbc value. In an aspect, the back volume compliance can represent a capacitance system settling to an equilibrium state. For instance, with reference to FIG. 4, plate element 440 and pressure sensor element 430 can represent plates of a capacitor. When a voltage is applied (e.g., via voltage source 534) to plate element 440, pressure sensor element 430 is displaced. When the voltage (e.g., de-asserting a voltage from voltage source 534) is released, a restoring force causes pressure sensor element 430 to return to a position of rest. It is noted that a pressure difference occurs between back cavity 410 and ambient atmosphere 420. This pressure difference is equalized when pressure sensor element 430 settles (e.g., Cbc reaches a constant). As described herein, a pressure can be determined based on the time, leakage path resistance, temperature, and the like.

As described herein, various factors (e.g., Rr, Rh, Cd, Ld, Mr, etc.) can be predetermined or dynamically determined. For instance, a leakage path may form in a MEMS pressure sensor and/or may be altered during the life of a MEMS pressure sensor. Accordingly, the leakage path resistance may be dynamically determined in a calibration process. As an example, an example MEMS pressure sensor may have been originally designed to have a sealed back cavity. Due to package damage or other factors, a leakage path may form in the MEMS pressure sensor. According to the above equations, the leakage resistance can be determined, for example, in a calibration process. As such, a traditional MEMS pressure sensor that is designed to have a sealed back cavity can be dynamically calibrated such that an unintentional leakage path(s) can be utilized.

Figure 6:
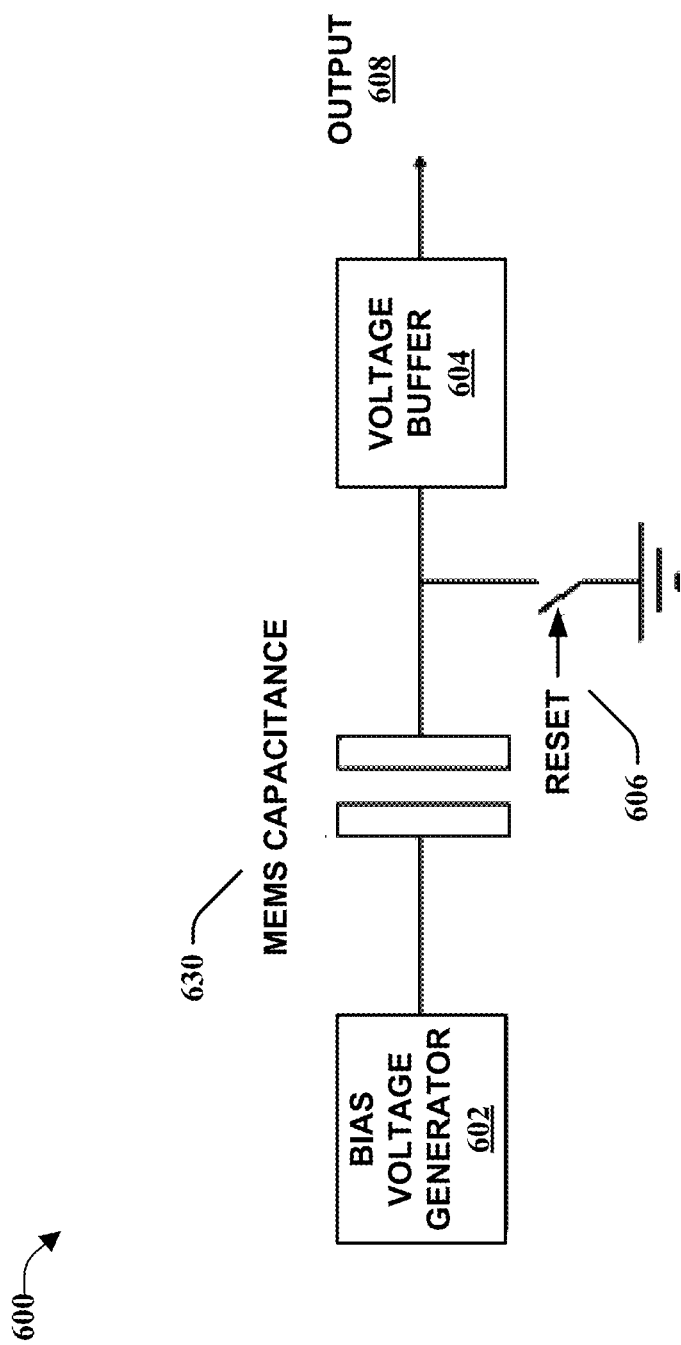
FIG. 6 depicts a non-limiting schematic of an exemplary circuit diagram of a MEMS pressure sensor system associated with a voltage generator, according to various non-limiting aspects of the subject disclosure.
Figure 7:
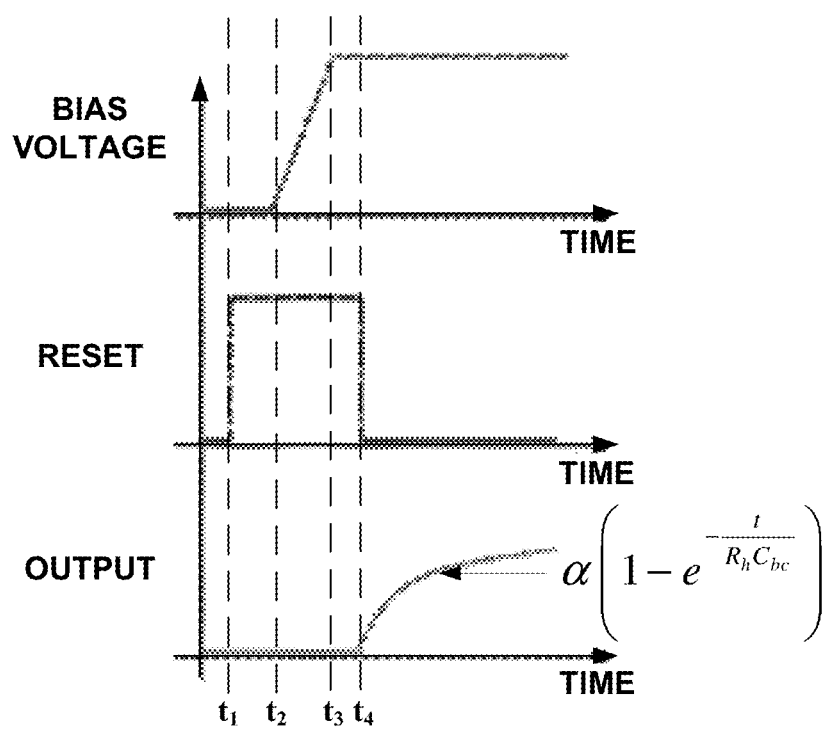
FIG. 7 depicts a non-limiting timing diagram associated with a MEMS pressure sensor comprising a leakage path, according to various non-limiting aspects of the subject disclosure.

Turning now to FIGS. 6-7, there illustrated are a circuit diagram of a system 600 for determining a pressure and a timing diagram 700 associated with system 600. For instance, system 600 can represent functionality or components described with reference to various embodiments disclosed herein. For instance, a controller (e.g., controller 452) can comprise a bias voltage generator 602 and a voltage buffer 604. A capacitor 630 can represent a MEMS capacitance between a membrane (e.g., sensor element 430) and a plate component (e.g., plate element 440).

In an example, capacitor 630 is at an initial position of rest at time $T_0$. For instance, a pressure sensor element (e.g., pressure sensor element 130, 230, 330, 430, etc.) is at an initial position. At or about time $T_1$, a reset switch 606 is asserted to connect a plate of capacitor 630 to ground. At or about time $T_2$, bias voltage generator 602 ramps up a voltage from zero to a bias voltage ($V_B$) at or about $T_3$. Reset is asserted during the charging (e.g., pump ramp time) to null out or cancel out capacitive feed-through and high frequency mechanical response. It is noted that the bias generator can be configured such that a ramp time (Tcp) is relatively smaller, according to a threshold, than the leakage resistance (Rh) times the back volume compliance (Cbc), that is the following condition is satisfied Tcp<<Rh*Cbc. Once the bias voltage fully ramps up to $V_B$, reset switch 606 can be altered to a desperate position. For instance, at or about time $T_4$, reset switch 606 can be flipped to de-assert reset. When reset is de-asserted, voltage buffer 604 can receive a value of the MEMS capacitance of capacitor 630. Moreover, at or about $T_4$, voltage buffer 604 can generate output 608 from zero or a substantially constant value to the exponential settling behavior of the MEMS capacitance over several time constants of Rh*Cbc. It is noted that the response can be represented by $$\alpha\left(1 - e^{-\frac{t}{R_hC_{bc}}}\right).$$

Finally, pressure information can be extracted from the time constant of the settling behavior, Rh*Cbc. It is noted that a controller (e.g., controller 452) can control various aspects of system 600. In another aspect, the controller can monitor and/or receive output 608 of system 600. Output 608 of system 600 can be utilized to determine a pressure and/or generate data for display to an interface.

While FIG. 7 depicts determining a time constant while a membrane is moved from an initial position (e.g., as seen in FIG. 1) to an intermediary position (e.g., as seen in FIG. 2), it is noted that the time constant can be determined upon occurrence of other events. For example, a membrane can be in an initial position (e.g., as seen in FIG. 1), can be deformed into an intermediary position (e.g., as seen in FIG. 2), and can then be released and allowed to settle (e.g., returned to the initial position or substantially returned to the initial position) to a resting position. In various embodiments, time constants can be determined during transition between any of the positions, such as between deforming the membrane from the initial position to the intermediary position, between deforming the membrane from the intermediary position to the resting position, and/or both. It is further noted that such terms as "resting position", "deformed position", and the like may be relative terms with respect to an initial position. For instance, an initial position or position of rest can be a position corresponding to the position depicted in FIG. 1, a position corresponding to the position depicted in FIG. 2, or another position.

Figure 8:
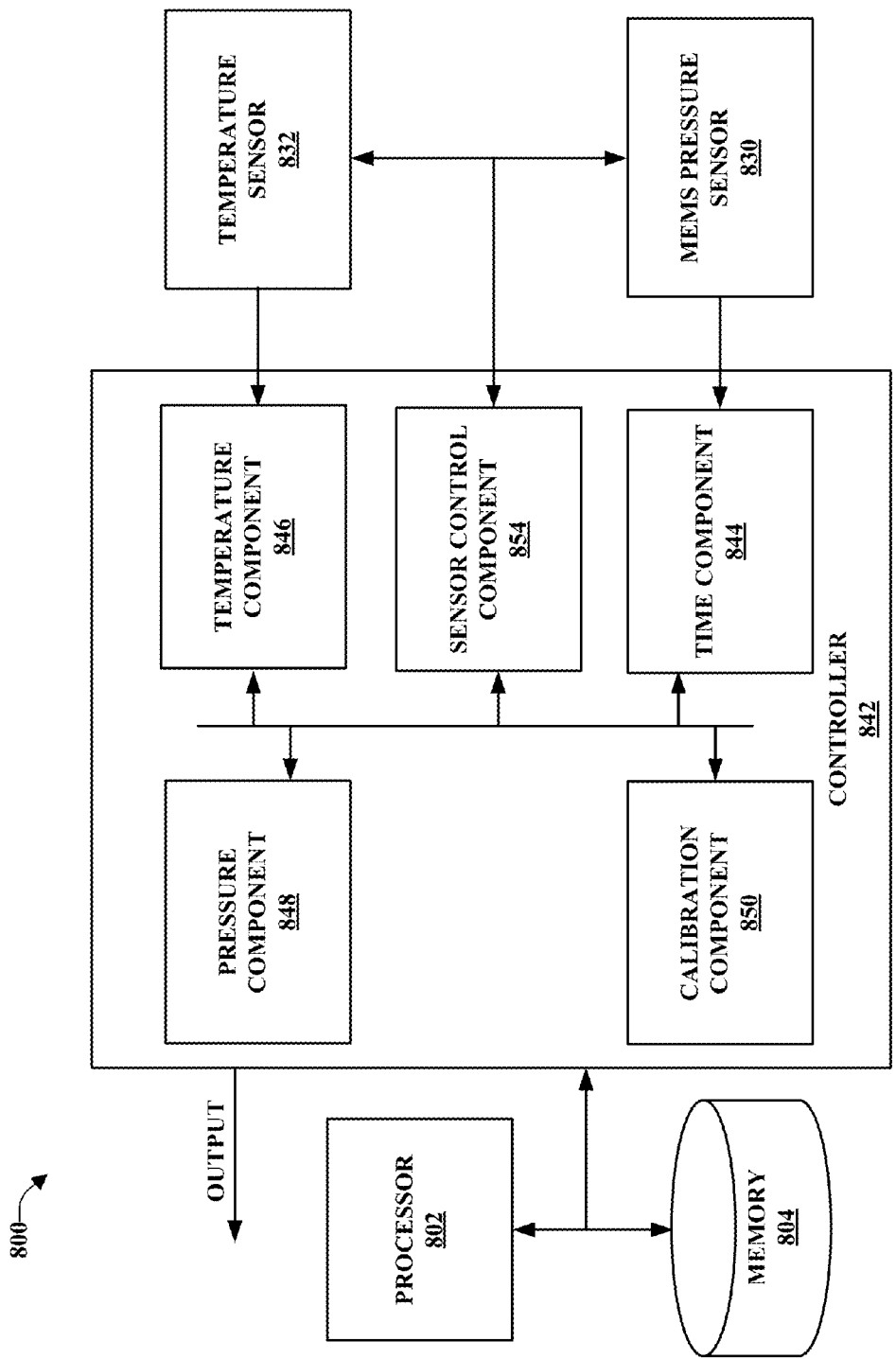
FIG. 8 depicts a non-limiting schematic of an exemplary block diagram of a MEMS pressure sensor system associated with a controller, according to various non-limiting aspects of the subject disclosure.

Turning now to FIG. 8, there illustrated is a system 800 for determining a pressure based on a MEMS pressure sensor and, additionally or optionally, a temperature sensor, according to various aspects disclosed herein. Aspects of systems, apparatuses or processes explained in this disclosure can constitute machine-executable components embodied within machine(s), hardware components, or hardware components in combination with machine executable components, e.g., embodied in one or more computer readable mediums (or media) associated with one or more machines. Such components, when executed by the one or more machines, e.g., computer(s), computing device(s), virtual machine(s), etc. can cause the machine(s) to perform the operations described. It is noted that all or some aspects of system 800 can be comprised in larger systems such as servers, computing devices, smart phones, and the like. While the various components are illustrated as separate components, it is noted that the various components can be comprised of one or more other components. Further, it is noted that the embodiments can comprise additional components not shown for sake of brevity. Additionally, various aspects described herein may be performed by one device or two or more devices in communication with each other.

System 800 can include a memory 804 that stores computer executable components and a processor 802 that executes computer executable components stored in memory 804. It is to be appreciated that system 800 can be used in connection with implementing one or more of the systems or components shown and described in connection with other figures disclosed herein. Controller 842 can comprise a time component 844 configured to determine a time constant associated with settling of a membrane of a MEMS pressure sensor 830 (e.g., system 100, 200, 300, 400, etc.), a temperature component 846 configured to determine a temperature (e.g., via input received from a temperature sensor 832), a pressure component 848 configured to determine a pressure of an ambient atmosphere or environment, and a calibration component 850 (which can calibrate various pressure sensors based on a determined pressure). Controller 842 can further comprise a sensor control component 854 to control aspects of various embodiments described herein (e.g., driving of voltage sources, sensing, timing of switches, etc.).

In embodiments, controller 842 can be coupled to one or more sensor devices or systems, such as MEMS pressure sensor 830, temperature sensor 832, and the like. It is noted that controller 842 can be comprised within larger systems. Likewise, controller 842 can also be coupled with additional sensors, such as traditional pressure sensor devices that utilize a closed or sealed cavity for determining an environmental pressure.

Controller 842 can facilitate driving and sensing via various sensor devices. For instance, controller 842 can control the driving of various voltages and/or generation of various control signals. In at least one embodiment, controller 842 can control circuitry associated with MEMS pressure sensor 830 according to timing diagram 700. Likewise, controller 842 can receive input from sensor systems, such as MEMS pressure sensor 830 and temperature sensor 832. In various aspects, controller 842 can receive pressure data from MEMS pressure sensor 830 and can receive temperature data from temperature sensor 832.

Time component 844 can monitor MEMS pressure sensor 830 and determine a time constant associated with settling of a membrane (e.g., sensor element 130, 230, 330, 430, etc.) of MEMS pressure sensor 830. Monitoring MEMS pressure sensor 830 can include determining when the membrane is moved or otherwise altered by a force, determining when the force is released, and determining a time constant(s) associated with the membrane coming to a resting a position after the force is released or removed. For instance, MEMS pressure sensor 830 can comprise a membrane and a plate that form a capacitor. When controller 842 applies a driving voltage to the plate, an attractive force acts on the membrane. Once the driving voltage is fully ramped (e.g., the membrane is fully displaced or not moving), the voltage can be released. Time component 844 can determine or store the time that the voltage is released and can determine when the membrane settles or substantially settles to a resting position. For instance, time component 844 can monitor an output of MEMS pressure sensor 830. When the output reaches a threshold value or when the output becomes constant or substantially constant, time component 844 can determine the membrane has settled. As described in various embodiments herein, time component 844 can determine a time constant associated with the settling. It is noted that time component 844 can monitor operations of MEMS pressure sensor 830 and can determine other parameters (e.g., low cutoff frequency, etc.) associated with sensing the pressure and/or sensing acoustic signals.

Pressure component 848 can determine an atmospheric pressure (e.g., environmental pressure) based on input received from time component 844. In an aspect, pressure component 848 can receive time information or other data associated with operations of MEMS pressure sensor 830. For instance, pressure component 848 can receive a time constant associated with settling or equalization of a membrane of MEMS pressure sensor 830. Based on the time constant, pressure component 848 can determine a measured pressure. In various embodiments, pressure component 848 can access a data store (e.g., memory 804, remote storage devices, etc.) for pressure information associated with time constants.

The sensitivity of the time constant (or a low cut-off frequency) is firstly dominated by pressure and secondly by temperature with only a fraction to leakage path resistance. In embodiments comprising temperature sensor 832, system 800 can eliminate or account for the temperature effect. In another aspect, a leakage path resistance (e.g., RH) value input from other sensors (not shown) or from a memory can also be utilized to determine the pressure. For instance, in at least one embodiment, pressure component 848 can alter (e.g., enhance) or determine a pressure based on the time data and temperature data received from temperature sensor 832. Pressure component 848 can utilize a function to adjust a determined pressure, utilize look up tables (e.g., stored in memory), utilize a conversion process, or the like.

In at least one embodiment, temperature component 846 and/or temperature sensor 832 can be separate components or systems. For instance, system 800 can comprise a user device having pressure sensor capabilities and having communication capabilities. System 800 can receive temperature information from other systems communicably connected (e.g., wirelessly, wired, etc.) with system 800. For example, a smart phone having pressure sensor capabilities, as described herein, can utilize temperature information received from a cellular communications network device (e.g., cell tower) or other wireless communications network device (e.g., server, etc.).

In another aspect, calibration component 850 can calibrate other pressure sensors based on a determined pressure. In an example, system 800 can comprise one or more other pressure sensor (not shown). The other pressure sensors can comprise traditional pressure sensors having sealed cavities, damage, or the like. The other pressure sensors can be calibrated based on a pressure determined according to MEMS pressure sensor 830. Calibration can occur upon detecting a triggering event. Such triggering events can include a command associated with a user, detecting an error or potential error associated with the other pressure sensors, passage of time (e.g., periodically), or the like.

For instance, calibration component 850 can implement an absolute pressure offset from MEMS pressure sensor 830 to a different pressure sensor. In another example, calibration component 850 can determine a leakage resistance of a different pressure sensor based on the absolute pressure offset from MEMS pressure sensor 830. The leakage resistance can be utilized in further operations of the different pressure sensor according to various aspects disclosed herein.

It is noted that calibration component 850 can monitor and/or store a history of calibrations associated with various pressure sensors. For example, system 800 can determine a pressure measured utilizing MEMS pressure sensor 830. Calibration component 850 can then calibrate another sensor based on the determined pressure, such as a pressure sensor having a sealed back cavity and/or different performance metrics. System 800 can determine another pressure at a later time based on MEMS pressure sensor 830 and can utilize this other pressure to and the previous calibration to determine another a pattern of behavior associated with the other pressure sensor. It is noted that various other instances of determining pressure and calibrating can be utilized.

Figure 9:
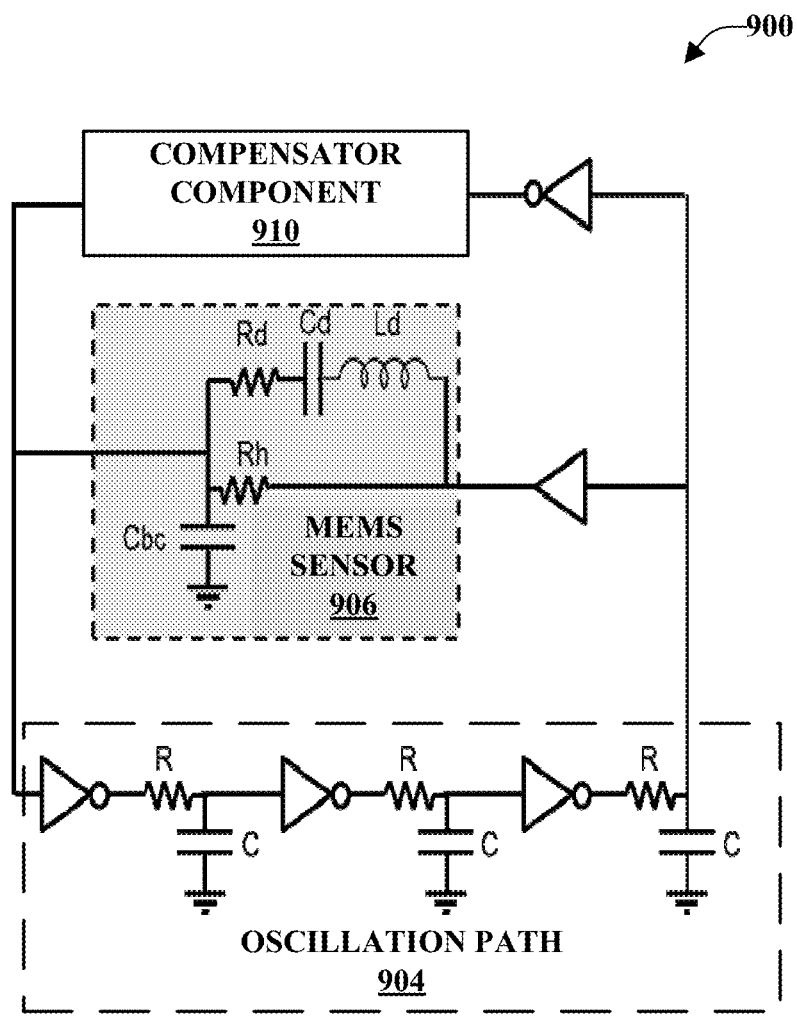
FIG. 9 depicts a non-limiting schematic of an exemplary circuit diagram of a MEMS pressure sensor system associated with an oscillation loop, according to various non-limiting aspects of the subject disclosure.

FIG. 9 depicts an exemplary circuit diagram of a system 900. System 900 can comprise a MEMS pressure sensor system comprising an oscillator loop configuration in accordance with various aspects disclosed herein. For instance, system 900 can determine an environmental pressure based in part on an oscillator coupled to a MEMS pressure sensor.

More particularly, system 900 can primarily comprise MEMS pressure sensor 906, oscillation path 904, and compensator component 910. As depicted, feed-through compensator component 910 can be a feed-through compensator of the oscillation path 904 coupled to the MEMS pressure sensor 906. In an aspect, MEMS pressure sensor 906 is embedded in an oscillator loop such that the oscillation frequency depends on the phase delay through system 900. A feedthrough cancelation path with opposite polarity can eliminate the contribution of direct feedthrough from system 900. In various embodiments, the pressure information can be extracted from the oscillation frequency, whose deviation from a nominal value $f_0$ will depend approximately on the back volume Cbc as:

$$\frac{\Delta f}{f_0} \propto -\frac{\Delta Cbc}{Cbc} \quad (5)$$

While, for the purposes of illustration, and not limitation, various non-limiting implementations of the subject disclosure are described herein in reference to placement, location, configuration, and so on, of MEMS sensor elements (e.g., membranes, diaphragms, etc.), it can be understood that variations of the subject disclosure are possible within the scope of the claims appended to the subject matter disclosed herein. For instance, it can be understood that other chip fabrication methods, methods of mechanical attachment, electrical connection, integration, ordering, placement, and so on can be employed or be desirable in conjunction with the subject disclosure, depending on, for instance, design considerations, etc. For instance, a back volume or cavity can be partitioned into two or more sub-back-cavities or volumes. Likewise, a vent hole can have multiple channels that divert air or other gaseous substances. As a non-limiting illustration, under normal conditions in which a microphone is intended to operate, any number or configuration of vent holes can be designed and implemented to behave as vent hole.

In view of the subject matter described supra, methods that can be implemented in accordance with the subject disclosure will be better appreciated with reference to the flowcharts of FIGS. 10-13. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter. It is noted that the various methods can utilize the systems, components, devices, and the like described with references to various embodiments disclosed herein.

Exemplary Methods

Figure 10:
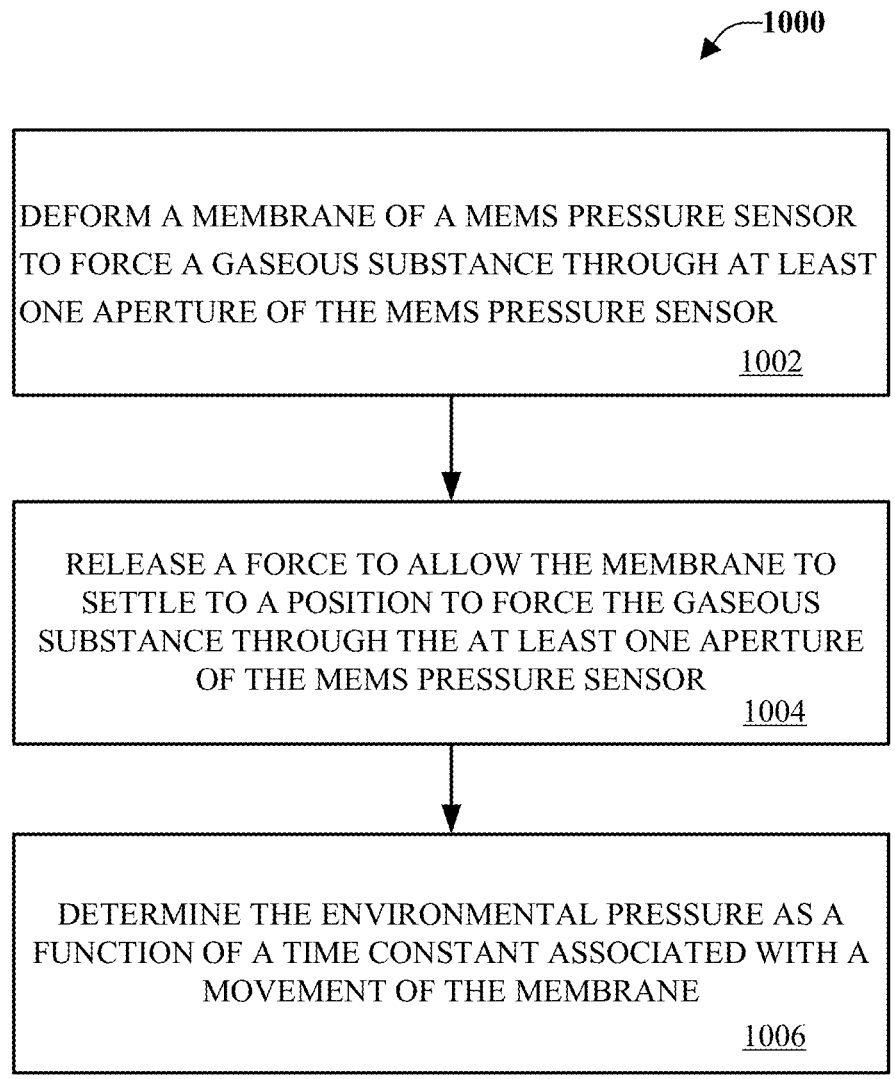
FIG. 10 depicts an exemplary flowchart of a non-limiting method associated with a MEMS pressure sensor and a leakage path, according to various non-limiting aspects of the disclosed subject matter.

FIG. 10 depicts an exemplary flowchart of non-limiting method 1000 associated with a MEMS pressure sensor system, according to various non-limiting aspects of the subject disclosure. As a non-limiting example, exemplary methods 1000 can comprise determining an environmental or atmospheric pressure utilizing a MEMS pressure sensor system having one or more leakage paths (e.g., system 100, 200, etc.).

At 1002, a system (e.g., system 100) can deform a membrane (e.g., sensor element 130) of a MEMS pressure sensor to force a gaseous substance through at least one aperture (e.g., vent holes 132) of the MEMS pressure sensor. For instance, a voltage can be applied to alter (e.g., deform, move, etc.) a membrane. In an aspect, with reference to FIG. 3, a voltage can be applied to form a voltage differential between sensor element 330 and plate element 340. The voltage differential can causes the membrane to move from an initial position to an intermediate position. For example, the applied voltage can alter or deform sensor element 330. It is appreciated that various other forces (e.g., mechanical, etc.) can be utilized and/or applied to deform the membrane, such as different electrical forces, mechanical forces, and the like.

At 1004, the system can release a force to allow the membrane to settle to a position to force the gaseous substance through the at least one aperture of the MEMS pressure sensor. In an example, the position can be a resting position or position of rest. It is appreciated that the resting position may or may not be an initial position.

In another aspect, releasing the force can cause a pressure difference between a back cavity and an ambient atmosphere. For instance, as the force is released, the membrane will settle or begin to settle to a resting position from an intermediate position. The settling will alter a volume of the back cavity and cause an imbalance in the atmospheric pressure and a pressure of the back cavity. Air will be forced through a leakage path to equalize the pressure.

At 1006, the system can determine (e.g., via controller 452, 842, etc.) the environmental pressure as a function of a time constant associated with a movement of the membrane. For instance, the movement of a membrane can be monitored based on an output of a system (e.g., output 608). The movement can be induced by releasing and/or applying a force to the membrane. In at least one embodiment, the movement is associated with allowing a membrane to settle or substantially settle at a resting position from an intermediate position (e.g., a position associated with an applied force). It is noted that determining the environmental pressure can comprise determining the pressure based on a lookup table associated with time constants, based on a function for converting the time constant to a pressure, or the like.

It is noted that various embodiments can determine environmental pressures as a function of a time constant during motion or movement of a membrane. In embodiments, the movement can occur when the membrane is moved from a resting position to another position. The resting position may be an initial position (e.g., prior to deformation) or may be an intermediate position (e.g., after deformation). For example, with reference to FIG. 7, a membrane can have an initial position (e.g., a resting position), such as seen in FIG. 1. A force acts on the membrane to deform the membrane into an intermediary position (e.g., as seen in FIG. 2). While the membrane is being deformed into the intermediary position, a time constant can be determined based on the membrane settling from the initial position to the intermediary position.

Figure 11:
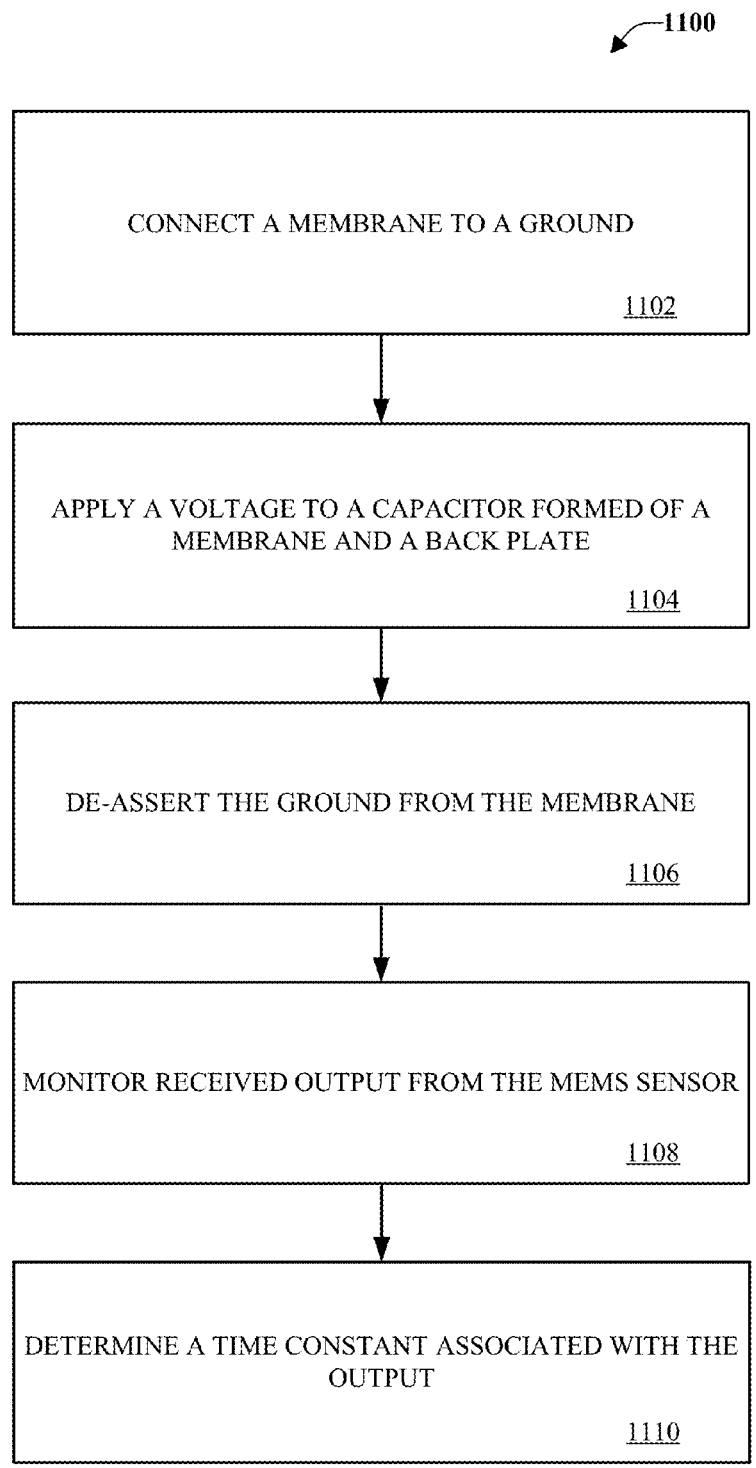
FIG. 11 depicts an exemplary flowchart of a non-limiting method associated with a MEMS pressure sensor and a leakage path including controlling a voltage applied to the MEMS pressure sensor systems, according to various non-limiting aspects of the disclosed subject matter.

In another example, FIG. 2 may depict the membrane in an initial position, where the membrane has been deformed and is held at or substantially at the position seen in FIG. 2 (a resting position in this example). A force acting on the membrane (e.g., restorative force) can be allowed to move the membrane to an intermediary position (e.g., as seen in FIG. 1). While the membrane is being altered into the intermediary position, a time constant can be determined based on the membrane settling from the initial position (as seen in FIG. 2) to the intermediary position (as seen in FIG. 1). Accordingly, such terms as "resting position", "initial position", "intermediary position", etc., can be relative terms based on a desired embodiment FIG. 11 depicts an exemplary flowchart of non-limiting method 1100 associated with a MEMS pressure sensor system including controlling a voltage applied to the MEMS pressure sensor systems, according to various non-limiting aspects of the subject disclosure. As a non-limiting example, exemplary methods 1100 can comprise determining an environmental or atmospheric pressure utilizing a MEMS pressure sensor system having one or more leakage paths (e.g., system 100, 200, etc.).

At 1102, a system (e.g., system 600) can connect (e.g., via reset switch 606) a membrane (e.g., sensor element 130, 230, etc.) to a ground. It is noted that a controller (e.g., controller 842, etc.) can control various circuitry or components to facilitate connecting the membrane to the ground. It is further noted that another component can be utilized to apply a reset signal (e.g., other than ground).

At 1104, the system can apply (e.g., via bias voltage generator 602) a voltage to a capacitor formed of a membrane (e.g., sensor element 430) and a back plate (e.g., plate element 440). In an aspect, the voltage can be a predetermined voltage and/or dynamically determined voltage. For instance, a voltage can be chosen based on power consumption requirements associated with a system. In another aspect, the voltage can be chosen between a range having a lower bound associated with a minimum voltage needed to induce deformation of the membrane and an upper bound associated with a maximum voltage associated with a power consumption threshold and/or based on operating parameters of a system. In various embodiments, the voltage can be ramped up to a desired level and held constant or substantially constant once the desired level is reached and for a determined period.

At 1106, the system can de-assert (e.g., via reset switch 606) the ground and/or reset from the membrane. According to various embodiments, de-asserting the reset can allow the membrane to move to a resting position. Moving to the resting position can induce a pressure difference between a back cavity and an ambient atmosphere.

At 1108, the system can monitor (e.g., via controller 842) received output from the MEMS sensor. The output may experience an exponential growth as the membrane moves to the resting position. Once the membrane comes to rest, the system, at 1110, can determine (e.g., via time component 844) a time constant associated with the output. For instance, the time constant can be generated based on the monitored output from the MEMS sensor. It is noted that the time constant can be utilized to determine a pressure and the pressure can be output (e.g., via an interface), stored, or otherwise utilized.

While various embodiments described herein refer to allowing a membrane of a MEMS pressure sensor to come to a resting position, it is appreciated that the systems and methods can be applied to various other embodiments. For instance, in an additional or alternative embodiment, a membrane (e.g., sensor element 330) and a back plate (e.g., plate element 340) can be configured to receive control signals causing various movements in the membrane. A time constant can be extracted based on monitoring the movement of the membrane from a resting position to a displaced position and the time constant can be utilized to determine a pressure. It is noted that the time constant may thus further depend on the applied voltage.

Figure 12:
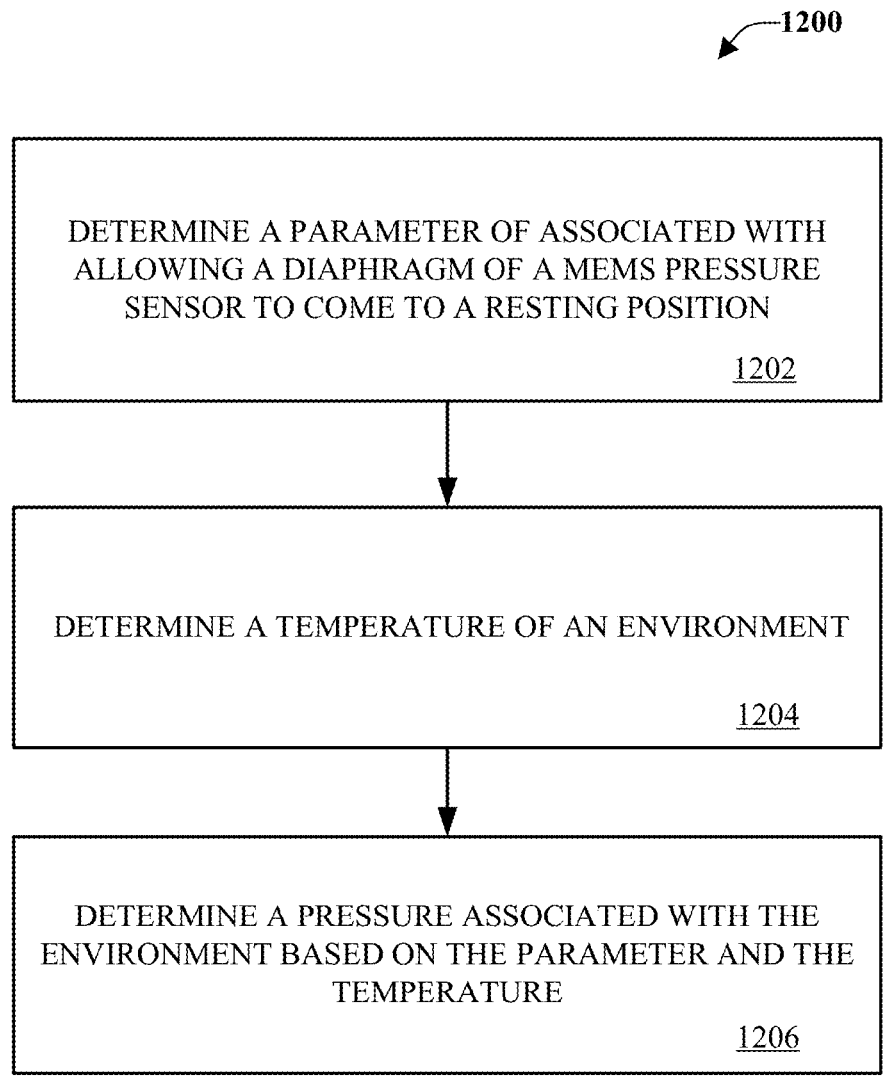
FIG. 12 depicts an exemplary flowchart of a non-limiting method associated with a MEMS pressure sensor and a leakage path including determining a pressure based on a time constant and a determined pressure, according to various non-limiting aspects of the disclosed subject matter.

FIG. 12 depicts an exemplary flowchart of non-limiting method 1200 associated with a MEMS pressure sensor system including determining a pressure based on a time constant and a determined pressure, according to various non-limiting aspects of the subject disclosure. As a non-limiting example, exemplary methods 1200 can comprise determining an environmental or atmospheric pressure utilizing a MEMS pressure sensor system having one or more leakage paths (e.g., system 100, 200, etc.).

At 1202, a system (e.g., system 800) can determine (e.g., via time component 844) a parameter associated with allowing a diaphragm of a MEMS pressure sensor to come to a resting position. In various aspects, the parameter can be determined as a time constant associated with the movement of the diaphragm from a starting position (e.g., intermediate position) to an ending position (e.g., resting position).

At 1204, the system can determine (e.g., via temperature component 846) a temperature of an environment. It is noted that the temperature can be determined based on data received from a temperature sensor (e.g., temperature sensor 832), data received from an external device (e.g., server, remote computer, etc.), and the like. For instance, a mobile device (e.g., comprising system 800) may not have an internal thermometer or temperature sensor. The mobile device can receive a measured temperature from another device with which the mobile device communicates (e.g., wired, wireless, etc.).

At 1206, the system can determine a pressure associated with the environment based on the parameter (e.g., time constant) and the temperature. As described herein, the time constant associated with the movement of the diaphragm may be dependent on the pressure and/or the temperature. Accordingly, the pressure may be determined and/or refined based on the determined temperature.

Figure 13:
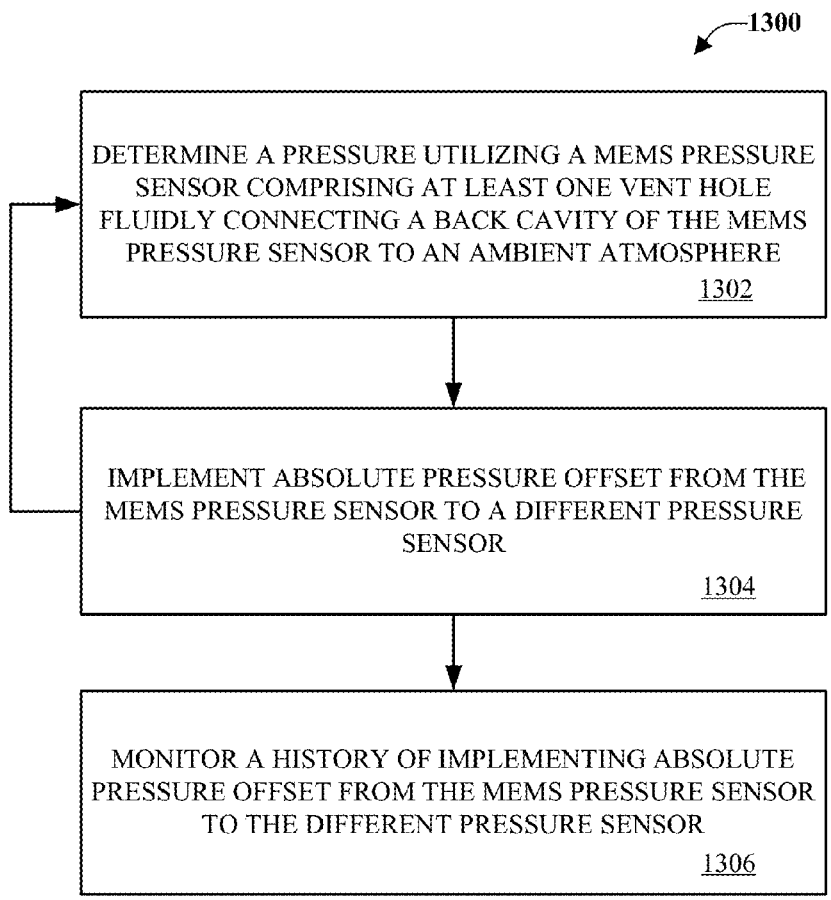
FIG. 13 depicts an exemplary flowchart of a non-limiting method associated with a MEMS pressure sensor and a leakage path including implementing absolute pressure offset to a different pressure sensor, according to various non-limiting aspects of the disclosed subject matter.

FIG. 13 depicts an exemplary flowchart of non-limiting method 1300 associated with a MEMS pressure sensor system including calibrating at least one other sensor, according to various non-limiting aspects of the subject disclosure. As a non-limiting example, exemplary methods 1300 can comprise determining an environmental or atmospheric pressure utilizing a MEMS pressure sensor system having one or more leakage paths (e.g., system 100, 200, etc.).

At 1302, a system (e.g., system 800) can determine a pressure utilizing a MEMS pressure sensor comprising at least one vent hole fluidly connecting a back cavity of the MEMS pressure sensor to an ambient atmosphere. At 1304, the system can implement (e.g., via calibration component 850) absolute pressure offset from the MEMS pressure sensor to a different pressure sensor. For instance, the system can calibrate various pressure sensors that may be different from the MEMS pressure sensors disclosed herein. In various embodiments, the system can iterate determining a pressure and calibrating other pressure sensors for a determined number of instances and/or based on user input.

At 1306, the system can monitor a history of implementing absolute pressure offset from the MEMS pressure sensor to the different pressure sensor. In various embodiments, monitoring the history of implementing absolute pressure offset can comprise monitoring adjustments and/or calibrations made for the different pressure sensors. The different pressure sensors can be determined as defective, not defective, or the like, based on the history. In another aspect, the history can be used to identify patterns for calibration.

The systems and processes described below can be embodied within hardware, such as a single integrated circuit (IC) chip, multiple ICs, an application specific ASIC, or the like. Further, the order in which some or all of the process blocks appear in each process should not be deemed limiting. Rather, it should be understood that some of the process blocks can be executed in a variety of orders, not all of which may be explicitly illustrated herein.

Figure 14:
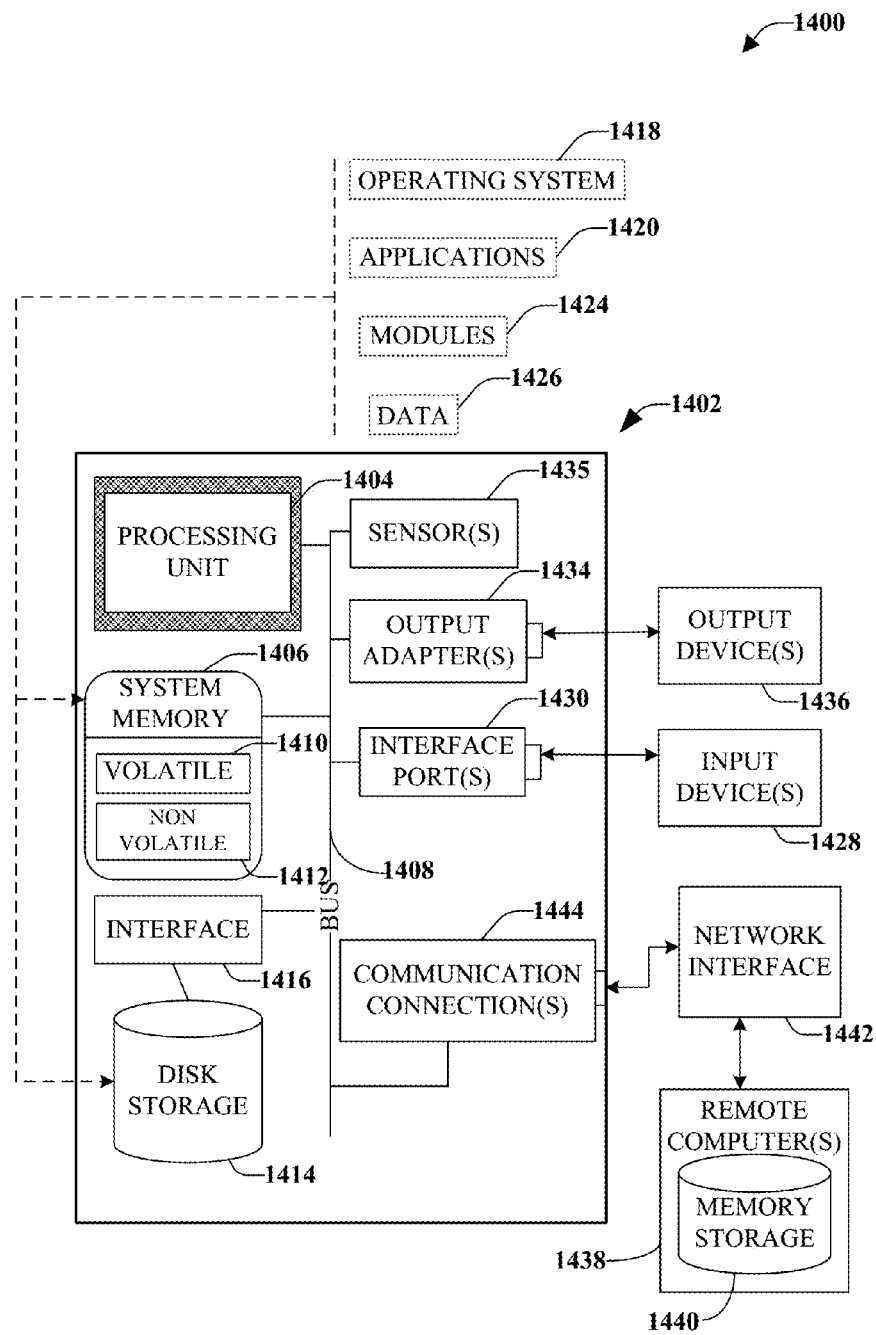
FIG. 14 depicts a block diagram of a computer operable to execute the disclosed pressure sensing.

With reference to FIG. 14, a suitable environment 1400 for implementing various aspects of the claimed subject matter includes a computer 1402. The computer 1402 includes a processing unit 1404, a system memory 1406, sensor(s) 1435 (e.g., acoustic sensor(s), pressure sensor(s), temperature sensor(s), etc.), and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1412. The basic input/output system (BIOS), containing the basic routines to transfer information between elements within the computer 1402, such as during start-up, is stored in non-volatile memory 1412. In addition, according to present innovations, sensor(s) 1435 may include at least one MEMS pressure sensor system, wherein the at least one MEMS pressure sensor system may consist of hardware, software, or a combination of hardware and software, according to various aspects disclosed herein. By way of illustration, and not limitation, non-volatile memory 1412 can include read only memory (ROM), programmable ROM (PROM), electrically programmable ROM (EPROM), electrically erasable programmable ROM (EEPROM), or flash memory. Volatile memory 1410 includes random access memory (RAM), which acts as external cache memory. According to present aspects, the volatile memory may store the write operation retry logic (not shown in FIG. 14) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1402 may also include removable/non-removable, volatile/non-volatile computer storage medium. FIG. 14 illustrates, for example, disk storage 1414. Disk storage 1414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1414 to the system bus 1408, a removable or non-removable interface is typically used, such as interface 1416. It is appreciated that storage devices 1414 can store information related to a user. Such information might be stored at or provided to a server or to an application running on a user device. In one embodiment, the user can be notified (e.g., by way of output device(s) 1436) of the types of information that are stored to disk storage 1414 and/or transmitted to the server or application. The user can be provided the opportunity to control having such information collected and/or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer system 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices 1436 like monitors, speakers, and printers, among other output devices 1436, which require special adapters. The output adapters 1434 include, by way of illustration and not limitation, video and sound cards that provide a means of connection between the output device 1436 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1444 refers to the hardware/software employed to connect the network interface 1442 to the bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A microelectromechanical systems (MEMS) pressure sensor comprising:
    an enclosure comprising a back cavity, wherein the MEMS pressure sensor is configured to measure a pressure;
    a movable membrane positioned between the back cavity and an ambient atmosphere external to the MEMS pressure sensor; and
    at least one vent hole fluidly connecting the back cavity to the ambient atmosphere, wherein a vent hole of the at least one vent hole is dispersed at an acute or obtuse angle relative to the back cavity.

2. The MEMS pressure sensor of claim 1, further comprising a controller coupled to the MEMS pressure sensor and configured to utilize the movable membrane to facilitate driving and sensing.

3. The MEMS pressure sensor of claim 2, wherein the controller comprises a time component configured to determine a time constant associated with pressure equalization in response to altering the movable membrane.

4. The MEMS pressure sensor of claim 3, wherein the controller further comprises a pressure component configured to determine the pressure based on the time constant.

5. The MEMS pressure sensor of claim 2, further comprising:
    a temperature sensor configured to determine a temperature, wherein the controller is further configured to determine the pressure based on the temperature.

6. The MEMS pressure sensor of claim 2, wherein the controller further comprises a sensor control module configured to control the MEMS pressure sensor.

7. The MEMS pressure sensor of claim 1, further comprising:
    a calibration component configured to implement absolute pressure offset from the MEMS pressure sensor to a different pressure sensor.

8. The MEMS pressure sensor of claim 7, wherein the different pressure sensor comprises a sealed cavity.

9. The MEMS pressure sensor of claim 1, further comprising a MEMS microphone.

10. The MEMS pressure sensor of claim 1, wherein the MEMS pressure sensor is in an oscillator loop configuration comprising an oscillator coupled to the MEMS pressure sensor.

11. The MEMS pressure sensor of claim 10, further comprising a feed-through compensator component configured to compensate an oscillation frequency of the oscillator based on a phase delay of the oscillator loop configuration.

12. The MEMS pressure sensor of claim 1, further comprising a plate component positioned adjacent to the movable membrane, the plate component and the movable membrane forming a capacitor.

13. A method comprising:
deforming a membrane of a microelectromechanical systems (MEMS) pressure sensor enclosed in a sensor package comprising a lid and a package substrate to force a gaseous substance through at least one aperture of the MEMS pressure sensor coupling a back cavity to an ambient atmosphere external to the sensor package, wherein an aperture of the at least one aperture is dispersed at an angle that is obtuse or acute with respect to a bottom portion of the back cavity; and
determining, based on a signal from the MEMS pressure sensor to a controller, an environmental pressure.

14. The method of claim 13, wherein the determining comprises:
determining the environmental pressure as a function of a time constant associated with a movement of the membrane.

15. The method of claim 13, further comprises:
allowing the membrane to settle to a position to force the gaseous substance through the at least one aperture of the MEMS pressure sensor.

16. The method of claim 13, further comprising:
determining a low frequency cut-off of the MEMS pressure sensor associated with a movement of the membrane.

17. The method of claim 13, wherein deforming the membrane further comprises:
applying a voltage between the membrane and a plate adjacent to the membrane to deform the membrane.

18. A micro electro-mechanical system (MEMS) pressure sensor, comprising:
means for altering a diaphragm, positioned between a back cavity of the MEMS pressure sensor and an ambient atmosphere external to the MEMS pressure sensor, from a first position to a second position, the MEMS pressure sensor comprising at least one vent hole fluidly connecting the back cavity to the ambient atmosphere at an obtuse or acute angle with respect to a bottom portion of the back cavity; and
means for determining a pressure based on a parameter associated with altering the diaphragm from the first position to the second position.

19. The MEMS pressure sensor of claim 18, wherein the means for determining the pressure further comprises:
means for determining the parameter as a function of time associated with altering the diaphragm from the first position to the second position.

20. The MEMS pressure sensor of claim 18, wherein the means for altering the diaphragm comprises means for deforming the diaphragm from a third position to the first position, and further comprising:
means for allowing the diaphragm to settle from the first position to the second position.

21. The MEMS pressure sensor of claim 18, further comprising:
means for receiving an acoustic signal via the diaphragm; and
means for converting the acoustic signal to an electronic signal.

* * * * *